(12) United States Patent
Tsoukalas et al.

(10) Patent No.: US 12,477,812 B2
(45) Date of Patent: Nov. 18, 2025

(54) SELF-ALIGNED GATE ISOLATION FOR MULTI-DIRECTIONAL GATE LAYOUTS IN QUANTUM AND SEMICONDUCTOR DEVICES

(71) Applicant: International Business Machines Corporation, Armonk, NY (US)

(72) Inventors: Konstantinos Tsoukalas, Zurich (CH); Patrick Harvey-Collard, Zurich (CH); Andreas Fuhrer Janett, Zurich (CH); Felix Julian Schupp, Zurich (CH); Matthias Mergenthaler, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 18/226,189

(22) Filed: Jul. 25, 2023

(65) Prior Publication Data

US 2025/0040232 A1   Jan. 30, 2025

(51) Int. Cl.
*H10D 84/01*   (2025.01)
*H10D 84/00*   (2025.01)
(Continued)

(52) U.S. Cl.
CPC ......... *H10D 84/0135* (2025.01); *H10D 84/00* (2025.01); *H10D 84/0151* (2025.01); *H10D 84/038* (2025.01); *H10D 86/00* (2025.01)

(58) Field of Classification Search
CPC ................ H10D 30/01; H10D 30/014; H10D 30/019–0198; H10D 30/024;
(Continued)

(56) References Cited

U.S. PATENT DOCUMENTS

2007/0080380 A1   4/2007  Chang
2012/0280290 A1*  11/2012 Khakifirooz ......... H10D 64/017
                                                                257/288
(Continued)

FOREIGN PATENT DOCUMENTS

CN   111682073 A   9/2020

OTHER PUBLICATIONS

Crawford, O. et al., "Compilation and scaling strategies for a silicon quantum processor with sparse two-dimensional connectivity", Applied Physics Letters, 2021, p. 104004-1 / 104004-19, 118(10), Germany.
Geyer, S., et al., "Self-aligned gates for scalable silicon quantum computing", Applied Physics Letters, Mar. 12, 2021, p. 104004-1 / 104004-7, 118(10), AIP Publishing, United States.
(Continued)

*Primary Examiner* — Cheung Lee
(74) *Attorney, Agent, or Firm* — Anthony Curro (57) ABSTRACT

One embodiment of the invention provides a method for fabricating a self-aligned gate structure comprising forming at least one first trench having a first width and at least one second trench having a second width in a gate structure comprising a first metallic gate layer. The first width is smaller than the second width. The method comprises depositing at least one conformal dielectric layer on the first metallic gate layer. The dielectric layer completely fills the first trench and partially fills the second trench, such that a portion of the second trench is unfilled. The method comprises depositing a conformal second metallic gate layer on the dielectric layer. The second metallic gate layer fills the unfilled portion of the second trench. The method comprises removing portions of the second metallic gate layer to expose the dielectric layer. Remaining portions of the second metallic gate layer include self-aligned metallic gate electrodes.

18 Claims, 8 Drawing Sheets

(51) Int. Cl.
*H10D 84/03* (2025.01)
*H10D 86/00* (2025.01)

(58) Field of Classification Search
CPC .... H10D 30/402; H10D 48/01; H10D 48/383; H10D 48/3835; H10D 64/311; H10D 84/00; H10D 84/01; H10D 84/0135; H10D 84/0144; H10D 84/0147; H10D 84/0151; H10D 84/02; H10D 84/032; H10D 84/035; H10D 84/038; H10D 84/05; H10D 84/07; H10D 84/08; H10D 84/83; H10D 84/8311; H10D 84/8312; H10D 84/83125; H10D 84/83135; H10D 84/83138; H10D 84/8314; H10D 84/8316; H10D 84/832–833; H10D 84/835; H10D 84/836; H10D 84/837–839

See application file for complete search history.

(56) References Cited

U.S. PATENT DOCUMENTS

| | | |
|---|---|---|
| 2017/0317203 A1 | 11/2017 | Petta et al. |
| 2021/0280676 A1 | 9/2021 | Singh et al. |
| 2023/0051161 A1 | 2/2023 | Yong |

OTHER PUBLICATIONS

Geyer, S., et al., "Silicon quantum dot devices with a self-aligned second gate layer", Jul. 30, 2020, pp. 1-9, arXiv preprint arXiv:2007.15400, United States.

Gilbert, W., et al., "Single-Electron Operation of a Silicon-CMOS 2×2 Quantum Dot Array with Integrated Charge Sensing", Nano Letters, Oct. 27, 2020, pp. 7882-7888, ACS Publications, United States.

Boter, J.M., et al., "Spiderweb array: A sparse spin-qubit array", Physical Review Applied, Aug. 19, 2022, p. 024053-1 / 024053-20, 18(2), American Physical Society, United States.

Zwerver, A.M.J., et al., "Qubits made by advanced semiconductor manufacturing," Nature Electronics 5, Apr. 27, 2022, p. 184-190, vol. 5, The Netherlands.

Camenzind, L. C., et al., "A hole spin qubit in a fin field-effect transistor above 4 kelvin," Nature Electronics, Mar. 5, 2022, pp. 178-183, vol. 5, n. 3, United States.

Maurand, R., et al., "A CMOS silicon spin qubit," Nature Communications 7, Nov. 24, 2016, p. 1-9, vol. 7(1), United States.

Lee, N., et al., "Enhancing electrostatic coupling in silicon quantum dot array by dual gate oxide thickness for large-scale integration." Applied Physics Letters 116.16, Apr. 23, 2020, pp. 1-4, AIP Publishing, United States.

\* cited by examiner

SELF-ALIGNED GATE ISOLATION FOR MULTI-DIRECTIONAL GATE LAYOUTS IN QUANTUM AND SEMICONDUCTOR DEVICES

This invention was made with government support under project NCCR SPIN 2020_65 awarded by the Swiss National Science Foundation.

BACKGROUND

The field of embodiments of the invention generally relate to quantum and semiconductor devices.

A complementary metal-oxide semiconductor (CMOS) is used in most of today's integrated circuits (ICs). CMOS transistors are based on metal-oxide semiconductor field-effect transistors (MOSFETs).

In quantum computing, a qubit (or quantum bit) is a basic unit of quantum information that is physically realized with a two-state quantum-mechanical system (i.e., a qubit platform).

SUMMARY

Embodiments of the invention generally relate to quantum and semiconductor devices, and more specifically, self-aligned gate isolation for multi-directional gate layouts in quantum and semiconductor devices.

One embodiment of the invention provides a method for fabricating a self-aligned gate structure with multiple metallic gate electrodes. The method comprises forming at least one first trench having a first width in a gate structure comprising a first metallic gate layer of metallic gate electrodes, and forming at least one second trench having a second width in the gate structure. The first width is smaller than the second width. The method further comprises depositing at least one conformal dielectric layer on the first metallic gate layer, where the at least one conformal dielectric layer completely fills the at least one first trench, and the at least one conformal dielectric layer partially fills the at least one second trench, such that a portion of the at least one second trench is unfilled. The method further comprises depositing a conformal second metallic gate layer of metallic gate electrodes on the at least one conformal dielectric layer, where the conformal second metallic gate layer fills up the unfilled portion of the at least one second trench. The method further comprises removing one or more portions of the conformal second metallic gate layer to expose the at least one conformal dielectric layer. One or more remaining portions of the conformal second metallic gate layer include self-aligned metallic gate electrodes. Other embodiments include a structure with a self-aligned metallic gate electrodes. These features contribute to the advantages of implementing intersection elements (e.g., T-junction elements) or terminals (i.e., terminating metallic gate electrodes) in a scalable self-aligned gate structure while maintaining high gate density using two metallic gate layers in two distinct directions.

One or more of the following features may be included.

In some embodiments, a thickness of the at least one conformal dielectric layer is larger than a first value that is equal to half of the first width, and the thickness of the at least one conformal dielectric layer is smaller than a second value that is equal to half of the second width.

In some embodiments, the one or more portions of the conformal second metallic gate layer are removed via a blanket etch.

In some embodiments, the one or more portions of the conformal second metallic gate layer are removed via chemical-mechanical polishing (CMP).

In some embodiments, the self-aligned metallic gate electrodes are isolated or terminated.

In some embodiments, the self-aligned gate structure is one-dimensional (1D).

In some embodiments, the self-aligned gate structure is two-dimensional (2D).

In some embodiments, the self-aligned gate structure comprises at least one array of channels, fins, or functional sites that run in at least one linear section. In some embodiments, the self-aligned gate structure further comprises at least one additional array of metallic gate electrodes that run in a different direction relative to the at least one array of channels, fins, or functional sites. In some embodiments, the self-aligned gate structure further comprises one or more intersection elements, wherein each intersection element is between two or more channels, fins, or functional sites that run in different directions.

Additional aspects of the present disclosure are directed to systems and computer program products configured to perform the methods described above. The present summary is not intended to illustrate each aspect of, every implementation of, and/or every embodiment of the present disclosure.

BRIEF DESCRIPTION OF THE DRAWINGS

The subject matter which is regarded as embodiments of the invention are particularly pointed out and distinctly claimed in the claims at the conclusion of the specification. The foregoing and other objects, features, and advantages of embodiments of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Embodiments of the invention generally relate to quantum and semiconductor devices, and more specifically, self-aligned gate isolation for multi-directional gate layouts in quantum and semiconductor devices. One embodiment of the invention provides a method for fabricating a self-aligned gate structure with multiple metallic gate electrodes. The method comprises forming at least one first trench having a first width in a gate structure comprising a first metallic gate layer of metallic gate electrodes, and forming at least one second trench having a second width in the gate structure. The first width is smaller than the second width. The method further comprises depositing at least one conformal dielectric layer on the first metallic gate layer, where the at least one conformal dielectric layer completely fills the at least one first trench, and the at least one conformal dielectric layer partially fills the at least one second trench, such that a portion of the at least one second trench is unfilled. The method further comprises depositing a conformal second metallic gate layer of metallic gate electrodes on the at least one conformal dielectric layer, where the conformal second metallic gate layer fills up the unfilled portion of the at least one second trench. The method further comprises removing one or more portions of the conformal second metallic gate layer to expose the at least one conformal dielectric layer. One or more remaining portions of the conformal second metallic gate layer include self-aligned metallic gate electrodes. These features contribute to the advantages of implementing intersection elements (e.g., T-junction elements) or terminals (i.e., terminating metallic gate electrodes) in a scalable self-aligned gate structure while maintaining high gate density using two metallic gate layers in two distinct directions.

In some embodiments, a thickness of the at least one conformal dielectric layer is larger than a first value that is equal to half of the first width, and the thickness of the at least one conformal dielectric layer is smaller than a second value that is equal to half of the second width.

In some embodiments, the one or more portions of the conformal second metallic gate layer are removed via a blanket etch.

In some embodiments, the one or more portions of the conformal second metallic gate layer are removed via chemical-mechanical polishing (CMP).

In some embodiments, the self-aligned metallic gate electrodes are isolated or terminated.

In some embodiments, the self-aligned gate structure is one-dimensional (1D).

In some embodiments, the self-aligned gate structure is two-dimensional (2D).

In some embodiments, the self-aligned gate structure comprises at least one array of channels, fins, or functional sites that run in at least one linear section. In some embodiments, the self-aligned gate structure further comprises at least one additional array of metallic gate electrodes that run in a different direction relative to the at least one array of channels, fins, or functional sites. In some embodiments, the self-aligned gate structure further comprises one or more intersection elements, wherein each intersection element is between two or more channels, fins, or functional sites that run in different directions.

Another embodiment of the invention provides a structure comprising a first metallic gate electrode located on at least one channel, a second metallic gate electrode separated from the first metallic gate electrode by a first width, a first dielectric layer located between the first metallic gate electrode and the second metallic gate electrode, a third metallic gate electrode separated from the second metallic gate electrode by a second width, a second dielectric layer located between the second metallic gate electrode and third metallic gate electrode, and a self-aligned metallic gate electrode located between sidewalls of the second dielectric layer. The first dielectric layer fills an area between the first metallic gate electrode and the second metallic gate electrode. The second width is greater than the first width. The second dielectric layer has a substantially uniform thickness along sidewalls of each metallic gate electrode and the at least one channel.

In some embodiments, a thickness of the second dielectric layer is larger than half the first width.

In some embodiments, the first metallic gate electrode, the second metallic gate electrode, and the third metallic gate electrode are substantially parallel. In some embodiments, the first metallic gate electrode and the second metallic gate electrode are not parallel.

Complementary metal-oxide semiconductor (CMOS) compatible spin qubit platforms comprise locally linear qubit arrays. A locally linear qubit array relies on locally linear connectivity with a dense array of gates along the channel. To implement error correction, multi-directional connectivity is required. Multi-directional connectivity requires implementation of intersection elements (e.g., T-junction element) or terminals (e.g., terminating metallic gate electrodes) while maintaining a high gate density (i.e., many gates or a dense array of gates). An intersection element is formed between two or more channels in different directions. An intersection element allows for more than two locally linear chains (i.e., 1D chains) of qubits to come together.

To implement an intersection element while maintaining a high gate density, a locally linear qubit array requires a self-aligned second gate layer in which gates are not parallel at the intersection element (e.g., two sets of gates corresponding to two locally linear chains, where the gates may be at a 90 degree angle for a T-junction element). Similar gate arrangements or layouts may also occur in other semiconductor devices. Conventional fabrication processes, however, only work if all gates are parallel or if isolation is not required between gates of two different 1D chains. Conventional fabrication processes involve filling gaps between insulation layers (e.g., spacers). When using conventional fabrication processes, it is not possible to implement intersection elements (e.g., T-junction elements) or terminals (e.g., terminating metallic gate electrodes) while maintaining a high gate density.

Figure 1:
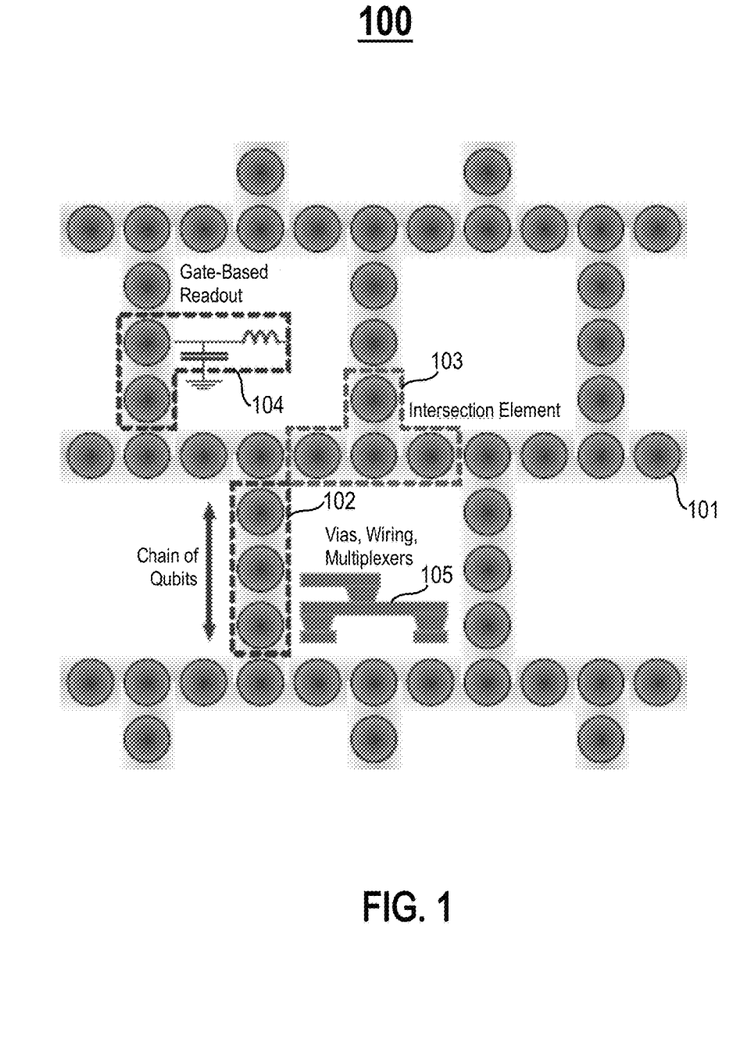
FIG. 1 illustrates an example locally linear qubit array.

FIG. 1 illustrates an example locally linear qubit array 100. The qubit array 100 comprises a plurality of qubits 101. The qubits 101 are arranged in a plurality of locally linear chains 102 of qubits 101. The qubit array 100 includes one or more intersection elements 103 (e.g., T-junction elements). Each intersection element 103 is formed by intersecting more than two locally linear chains 102 of qubits 101. The qubit array 100 includes one or more gates 104 for readout of the qubits 101. The qubit array 100 comprises one or more additional components 105 such as, but not limited to, vias, wiring, and multiplexers.

While electrostatically defined semiconductor quantum dot (QD) arrays may be used in CMOS compatible spin qubit platforms to physically realize qubits, such QD arrays require high reproducibility and small pitch dimensions. However, conventional fabrication processes for a self-aligned gate structure with multiple metallic gate electrodes per QD array do not work when there are two or more 1D chains (i.e., locally linear chains). Such conventional fabrication processes only work if all gates are parallel or if isolation is not required between gates of two different 1D chains.

A 2D self-aligned gate structure with multiple metallic gate electrodes comprises a grid of 1D arrays. The 2D self-aligned gate structure includes one or more intersection elements, wherein each intersection element is formed between/by more than two 1D arrays intersecting. Applying conventional fabrication processes for a 2D self-aligned gate structure results in shorts between gate electrodes. Additional alignment and etching steps may be incorporated to work around this shortcoming, but this in turn increases fabrication complexity and processing damage of QD arrays at intersection elements of the grid.

A gap width, or width, generally refers to a distance between metallic gate electrodes.

The term substantial, or substantially, as used throughout is interpreted to mean generally understood tolerances, variations, or limits based on manufacturing of the structure.

One or more embodiments provide a fabrication process for fabricating/implementing intersection elements (e.g., T-junction elements) or terminals (e.g., terminating metallic gate electrodes) in a scalable self-aligned gate structure, wherein the fabrication process maintains high gate density using two metallic gate layers in two distinct directions. The process utilizes two different gap widths for gaps between metallic gate electrodes of a first metallic gate layer. Specifically, the two different gap widths include a first gap width and a second width, wherein the first gap width is smaller than the second gap width. The first gap width represents a smaller gap width relative to the second gap width, and the second gap width represents a larger gap width relative to the first gap width. As part of the process, a first set of gaps of the first metallic gate layer that have the first/smaller gap width are completely filled with at least one conformal dielectric layer, whereas a second set of gaps of the first gate layer that have the second/larger gap width are only partially filled with the at least one conformal dielectric layer (i.e., remain partially open). After depositing a conformal second metallic gate layer on the at least one conformal dielectric layer and an etch, the first set of gaps of the first metallic gate layer that have the first/smaller gap width will not contain any portion of the conformal second metallic gate layer, whereas the second set of gaps of the first metallic gate layer that have the second/larger gap width will contain at least one portion of the conformal second metallic gate layer.

In one embodiment, the fabrication process enables self-alignment in ultra-high gate pitch junction elements. The fabrication process reduces fabrication complexity and processing damage of QD arrays at intersection elements of a grid architecture. The fabrication process improves alignment tolerance and uniformity of electrode arrays. The fabrication process extends access to ultra-small pitches in 2D gate arrays. The fabrication process is platform agnostic as it is compatible with different structures such as, but not limited to, fin field-effect transistors (FinFETs), planar geometries, etc.

For quantum technologies, the fabrication process results in reproducible 2D quantum dot (QD) arrays for CMOS compatible spin qubit platforms used in quantum computing technologies. For semiconductor technologies, the fabrication process extends access to ultra-small pitches in 2D gate arrays (i.e., extending beyond conventional fabrication process).

Figure 2A:
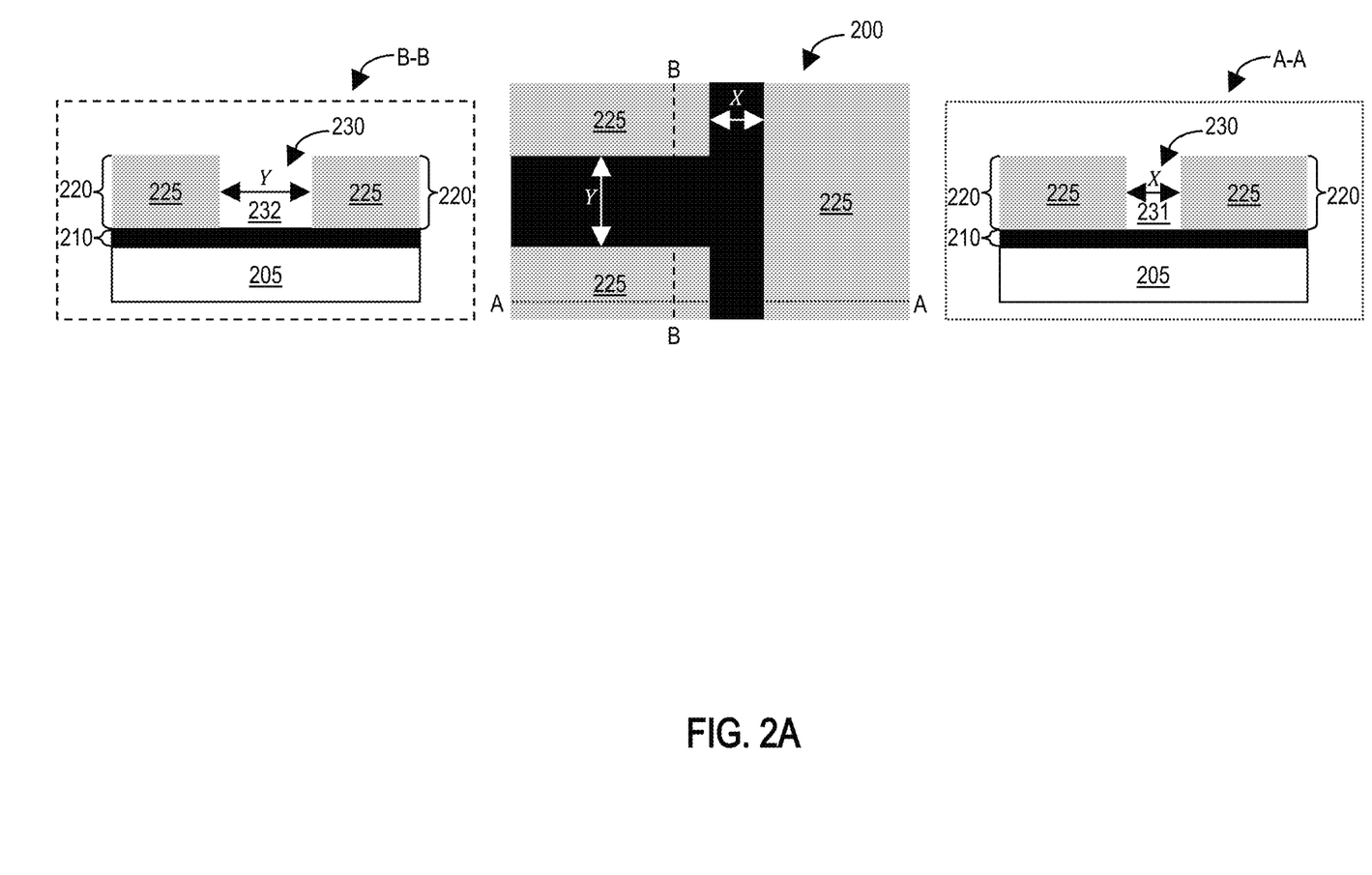
FIG. 2A illustrates a top-down view of an example gate structure and cross-sectional views A-A and B-B of the gate structure after implementing two different gap widths, in accordance with some embodiments of the invention.

FIG. 2A illustrates a top-down view of an example gate structure 200 and cross-sectional views A-A and B-B of the gate structure after implementing two different gap widths, in accordance with some embodiments of the invention. In some embodiments, the fabrication process utilizes a gate structure 200 comprising a planar substrate 205 and a first metallic gate layer 220 built on the planar substrate 205. In some embodiments, there are one or more additional gate arrangements below the planar substrate 205, such that the gate structure 200 includes first metallic gate layer 220 and the one or more additional gate arrangements. In some embodiments, the first metallic gate layer 220 is built instead on one or more fin shaped channels or corners thereof.

The first metallic gate layer 220 comprises a plurality of metallic gate electrodes 225 along one or more channels 210. The gate structure 200 includes a plurality of gaps 230 between the metallic gate electrodes 225 of the first metallic gate layer 220.

Figure 3:
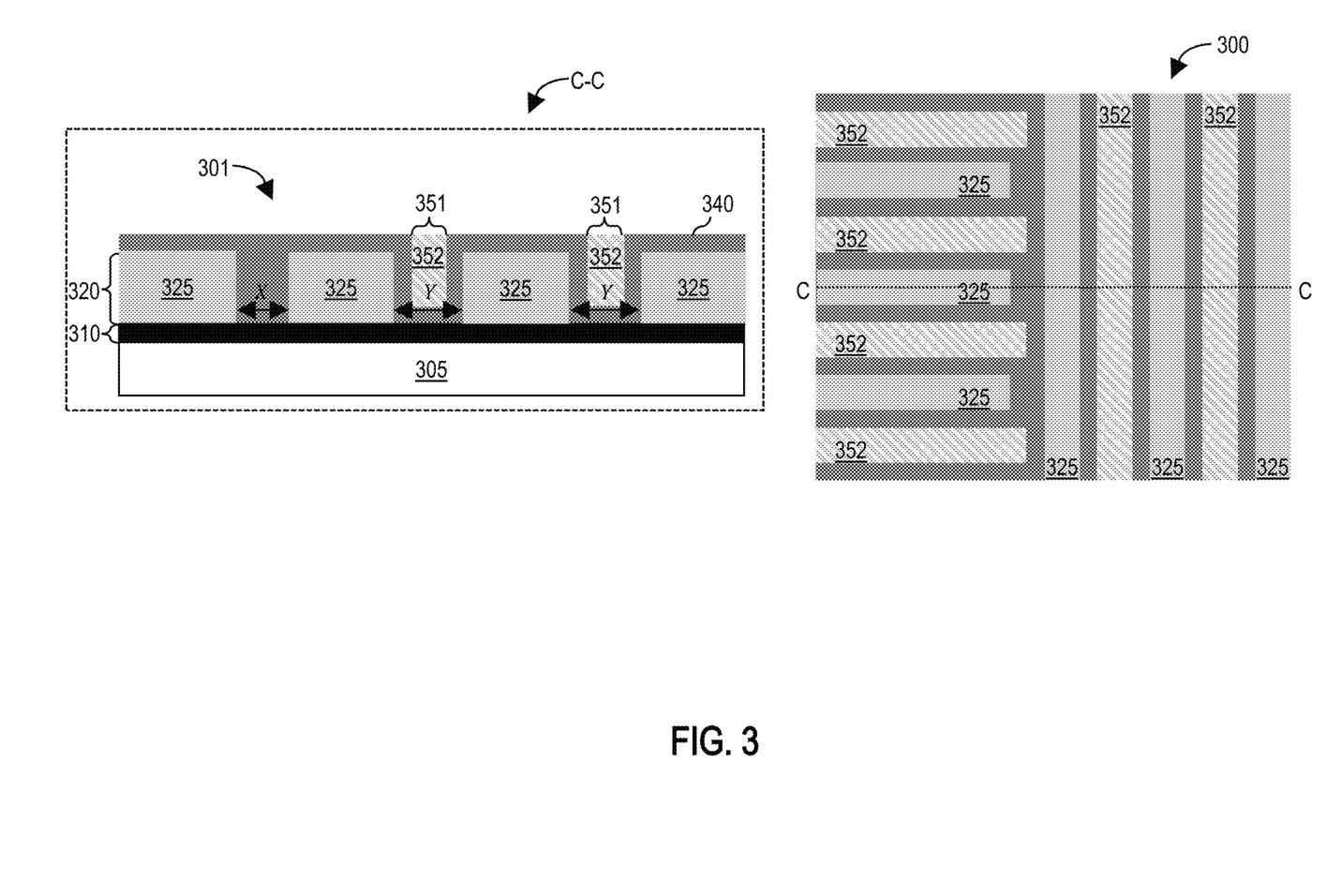
FIG. 3 illustrates a top-down view of another example self-aligned gate structure and a cross-sectional view C-C of the gate structure, in accordance with some embodiments of the invention.
Figure 4:
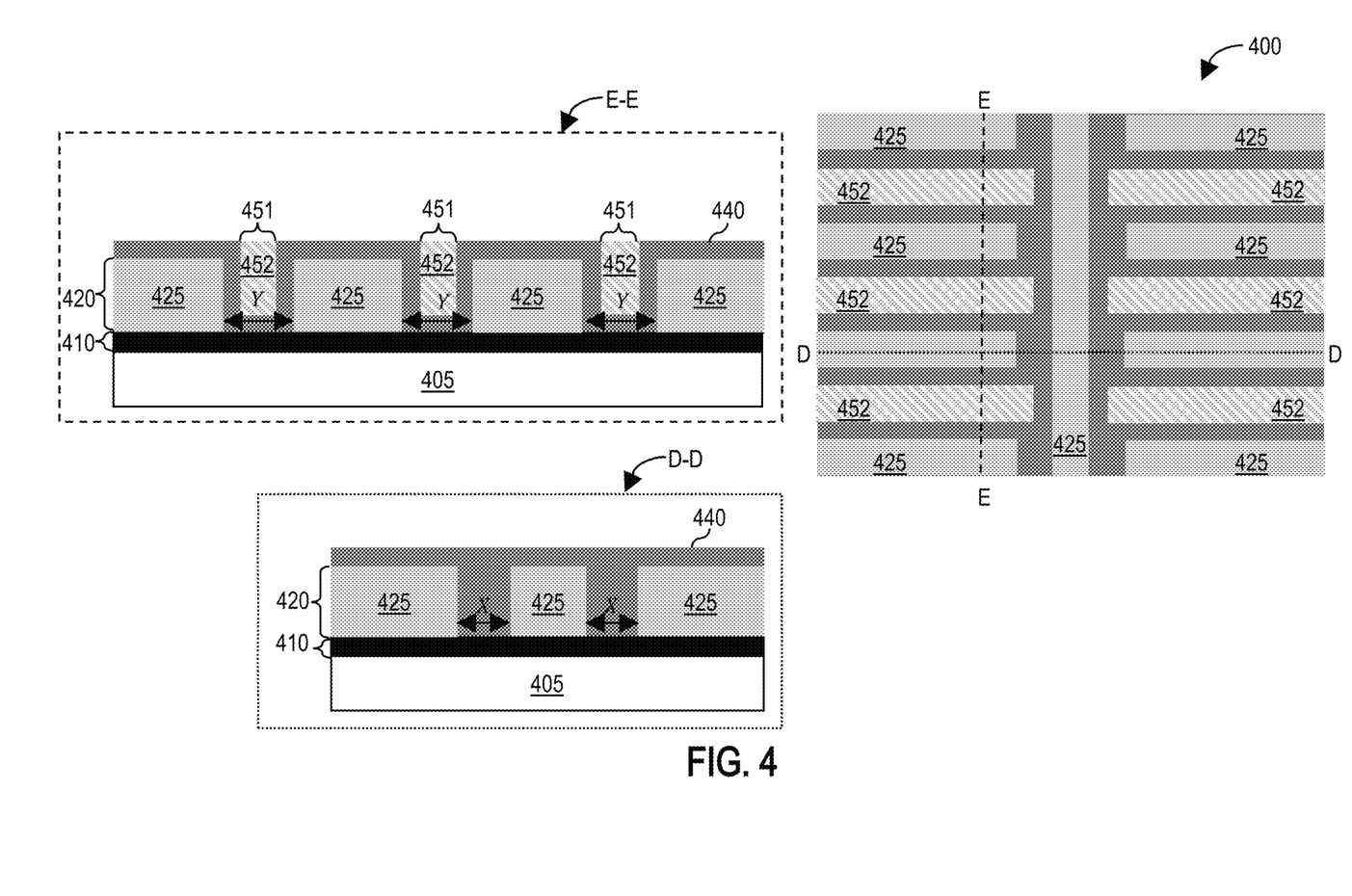
FIG. 4 illustrates a top-down view of another example self-aligned gate structure and cross-sectional views D-D and E-E of the gate structure, in accordance with some embodiments of the invention.

In some embodiments, the planar geometry of the gate structure 200 is a single QD array, as shown in FIGS. 2A-2D. In some embodiments, the planar geometry of the gate structure 200 is a T-junction element, as shown in FIG. 3. In some embodiments, the planar geometry of the gate structure 200 is parallel channels, as shown in FIG. 4.

In some embodiments, the fabrication process comprises one or more steps for implementing two different gap widths. The one or more steps for implementing two different gap widths includes: (1) for a first gap 231 of the gaps 230, implementing a first gap width X corresponding to the first gap 231 (i.e., forming at least one first trench having the first gap width X), and (2) for one or more remaining gaps 232 of the gaps 230, implementing second gap width Y corresponding to each remaining gap 232 (i.e., forming at least one second trench having the second gap width Y), wherein the first gap width X is smaller than the second gap width Y (i.e., X<Y). As shown in FIG. 2A, the two different gap widths run in different directions.

In some embodiments, if the first metallic gate layer 220 comprises titanium nitride (TiN) metallic gate electrodes and the planar substrate 205 comprises a silicon/silicon dioxide (Si/SiO$_2$) substrate, X=12 nm and Y=30 nm.

Figure 2B:
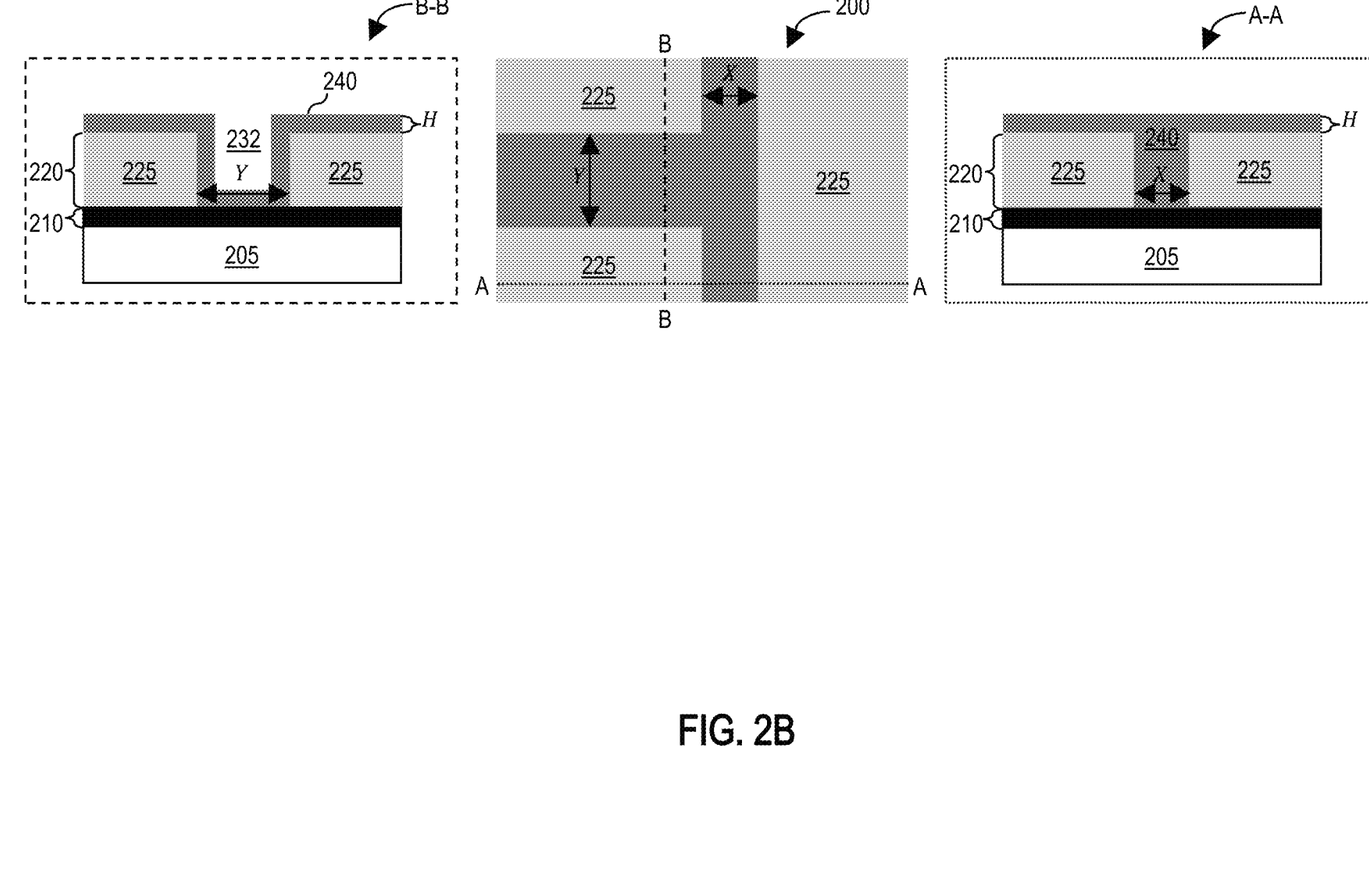
FIG. 2B illustrates a top-down view of the gate structure and cross-sectional views A-A and B-B of the gate structure after conformal dielectric deposition, in accordance with some embodiments of the invention.

FIG. 2B illustrates a top-down view of the gate structure 200 and cross-sectional views A-A and B-B of the gate structure after conformal dielectric deposition, in accordance with some embodiments of the invention. In some embodiments, the fabrication process comprises one or more steps for conformal dielectric deposition which occur after the two different gap widths X and Y are implemented. The one or more steps for conformal dielectric deposition include depositing at least one conformal dielectric layer 240 on the first metallic gate layer 220. After the conformal dielectric deposition, the at least one conformal dielectric layer 240 completely fills the first gap 231 having the corresponding gap width X (i.e., completely fills the at least one first trench), whereas the at least one conformal dielectric layer 240 only partially (i.e., not completely) fills each remaining gap 232 having the corresponding gap width Y (i.e., only partially fills the at least one second trench, such that a portion of the at least one second trench is unfilled). Specifically, as shown in FIG. 2B, the first gap 231 is completely closed, whereas each remaining gap 232 remains partially open. In some embodiments, the at least one conformal dielectric layer 240 has a corresponding thickness H, wherein $$\frac{Y}{2} > H > \frac{X}{2}.$$

In some embodiments, if the at least one conformal dielectric layer 240 comprises atomic layer deposition (ALD) $SiO_2$, H=6 nm.

As described in detail later herein, the at least one conformal dielectric layer 240 will isolate the first metallic gate layer 220 from a conformal second metallic gate layer 250 (FIG. 2C) when the conformal second metallic gate layer 250 is deposited later in the fabrication process.

Figure 2C:
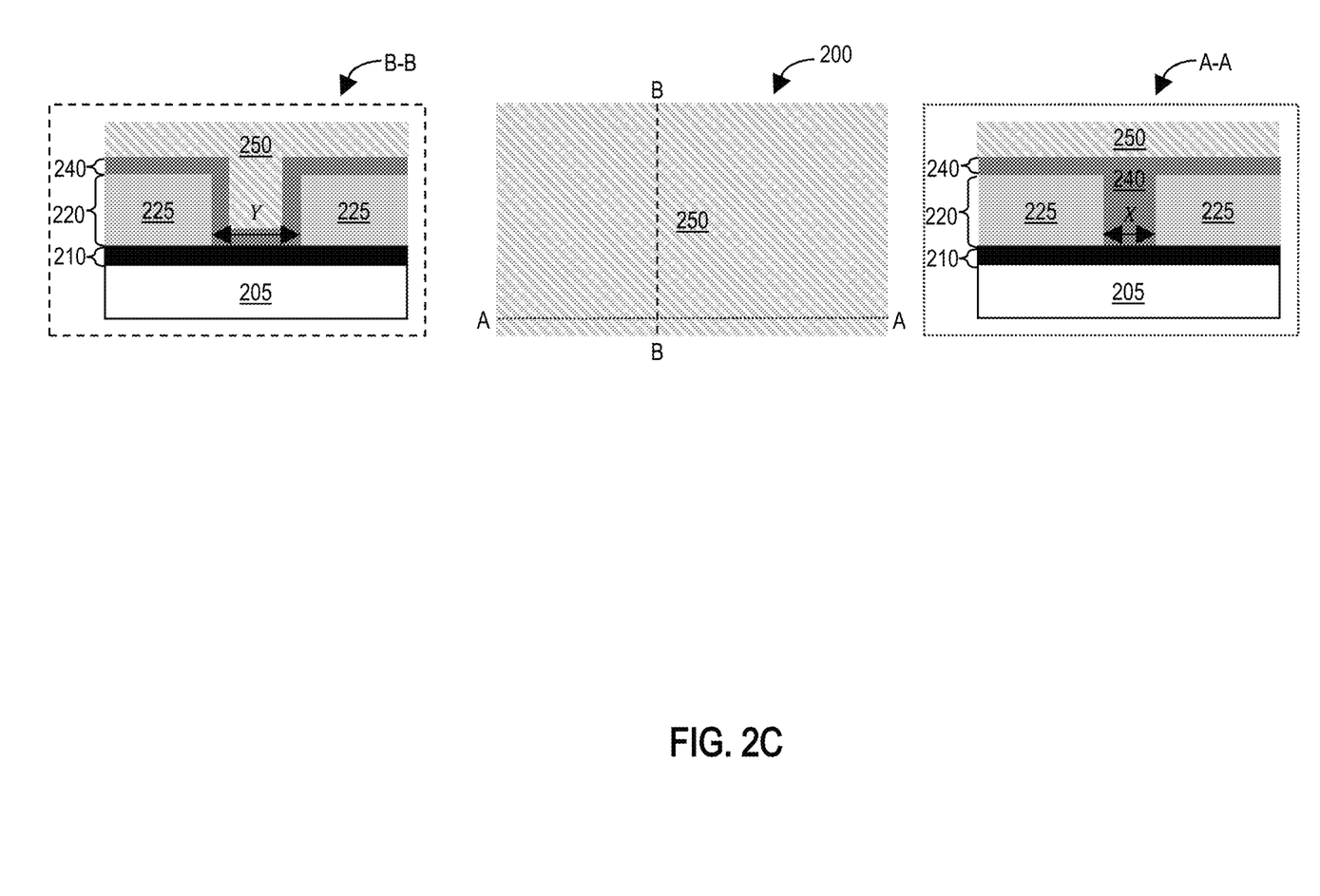
FIG. 2C illustrates a top-down view of the gate structure and cross-sectional views A-A and B-B of the gate structure after conformal metallic gate layer deposition, in accordance with some embodiments of the invention.

FIG. 2C illustrates a top-down view of the gate structure 200 and cross-sectional views A-A and B-B of the gate structure after conformal metallic gate layer deposition, in accordance with some embodiments of the invention. In some embodiments, the fabrication process comprises one or more steps for conformal metallic gate layer deposition which occur after the at least one conformal dielectric layer 240 is deposited. The one or more steps for conformal metallic gate layer deposition include depositing a conformal second metallic gate layer 250 on the at least one conformal dielectric layer 240, such that the conformal second metallic gate layer 250 fills up any partially open space of each remaining gap 232 having the corresponding gap width Y (i.e., fills up the unfilled portion of the at least one second trench), where the gap width Y is greater than the gap width X. The conformal second metallic gate layer 250 comprises a plurality of metallic gate electrodes. As shown in FIG. 2C, the at least one conformal dielectric layer 240 and the conformal second metallic gate layer 250 together completely fill each remaining gap 232 having the corresponding gap width Y.

In some embodiments, if the conformal second metallic gate layer 250 comprises TiN metallic gate electrodes, a thickness of any partially open space of each remaining gap 232 that the conformal second metallic gate layer 250 fills up is substantially above 15 nm.

Figure 2D:
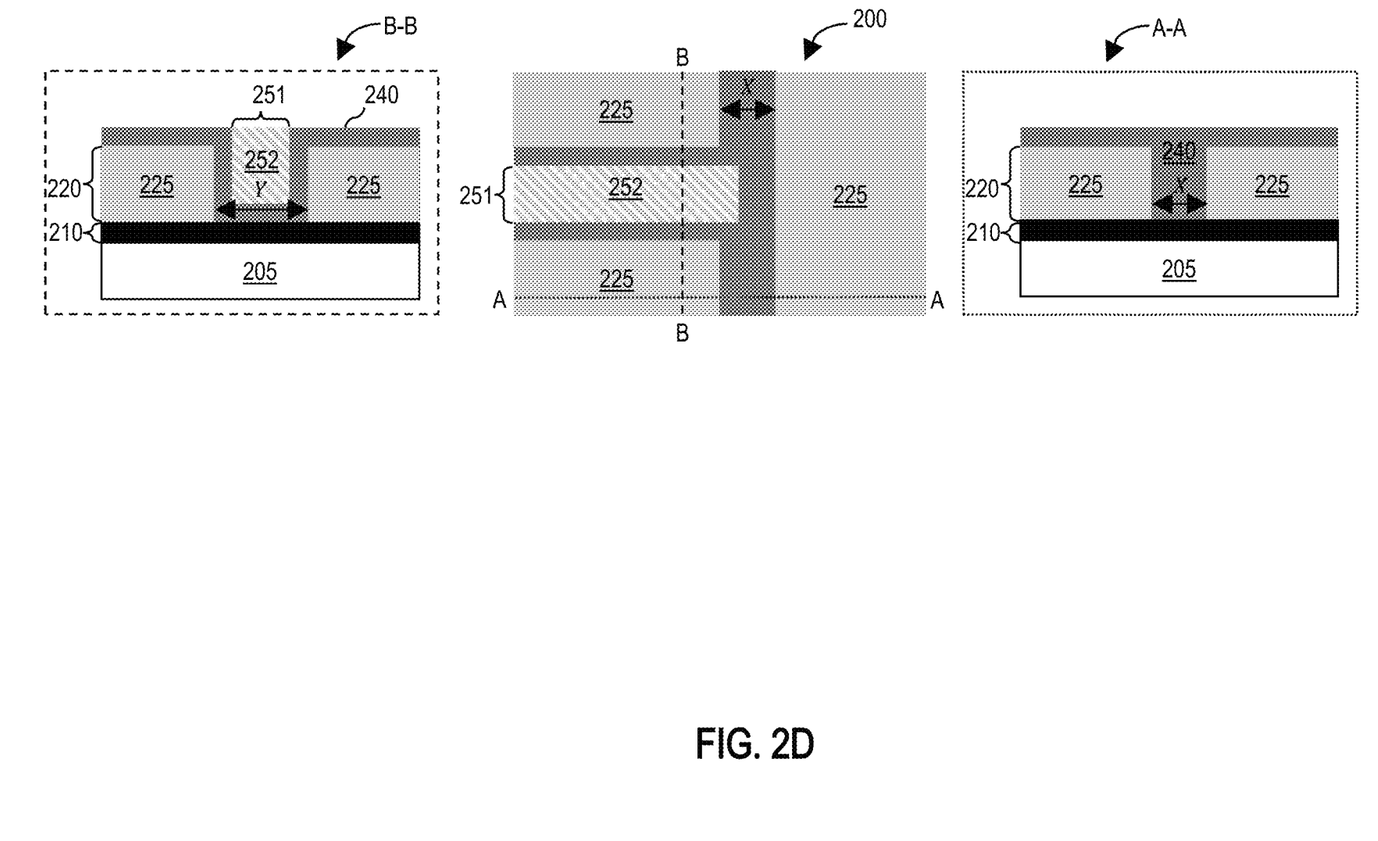
FIG. 2D illustrates a top-down view of the resulting self-aligned gate structure and cross-sectional views A-A and B-B of the gate structure after etching, in accordance with some embodiments of the invention.

FIG. 2D illustrates a top-down view of the resulting self-aligned gate structure 200 and cross-sectional views A-A and B-B of the gate structure after etching, in accordance with some embodiments of the invention. In some embodiments, the fabrication process comprises one or more steps for etching which occur after the conformal second metallic gate layer 250 is deposited. The one or more steps for etching include utilizing blanket etch or CMP to remove one or more portions of the conformal second metallic gate layer 250 (i.e., removing the one or more portions of the conformal second metallic gate layer 250 to expose the at least one conformal dielectric layer 240), such that one or more additional portions 251 of the conformal second metallic gate layer 250 remain ("remaining portions 251"). Blanket etch may be directional or isotropic, and does not require any mask. The one or more remaining portions 251 comprise self-aligned metallic gate electrodes 252. The fabrication process results in isolated self-aligned gates (i.e., the self-aligned metallic gate electrodes 252).

As shown in FIG. 2D, the at least one conformal dielectric layer 240 completely fills the first gap 231 having the corresponding gap width X, and the one or more remaining portions 251 fill the one or more remaining gaps 232 having the corresponding gap width Y, where the gap width Y is greater than the gap width X.

The self-aligned gate structure 200 is terminated in a self-aligned manner. As shown in FIG. 2D, the self-aligned gate structure 200 imposes/induces a 1D array of active/functional sites (e.g., qubits) in the linear channel sections (i.e., the one or more channels 210). As also shown in FIG. 2D, a first gate layout of the first metallic gate layer 220 is in a first direction, and a second gate layout of the one or more remaining portions 251 of the conformal second metallic gate layer 250 is in a second direction different from the first direction (i.e., the self-aligned gate structure 200 provides multi-directional connectivity). The fabrication process maintains high gate density using two metallic gate layers (i.e., the first metallic gate layer 220 and the one or more remaining portions 251) in two distinct directions.

In some embodiments, the fabrication process results in one or more arrays of channels, fins, or active/functional sites (e.g., qubits) that run in linear sections, and one or more additional arrays of metallic gate electrodes that run in a different direction/orientation across/over the channels, fins, or active/functional sites. For example, in some embodiments, the metallic gate electrodes run perpendicular across/over the channels, fins, or active/functional sites. As another example, in some embodiments, the metallic gate electrodes curve or go across/over the channels, fins, or active/functional sites at an angle.

The fabrication process is compatible with different structures such as, but not limited to, FinFETs, planar geometries, etc. In some embodiments, the planar geometry of the self-aligned gate structure is a single QD array, as shown in FIGS. 2A-2D. In some embodiments, the planar geometry of the self-aligned gate structure includes one or more T-junction elements, as shown in FIG. 3. In some embodiments, the planar geometry of the self-aligned gate structure includes parallel channels, as shown in FIG. 4.

In some embodiments, instead of metallic gate electrodes, each layer 220, 250 can comprise different material(s) or can function as resonators or waveguides. In some embodiments, the one or more channels 210 can be non-electronic (e.g., can be waveguides).

FIG. 3 illustrates a top-down view of another example self-aligned gate structure 300 and a cross-sectional view C-C of the gate structure, in accordance with some embodiments of the invention. In some embodiments, a fabrication process utilizes a gate structure 300 comprising a planar substrate 305 and a first metallic gate layer 320 built on the planar substrate 305. In some embodiments, there are one or more additional gate arrangements below the planar substrate 305, such that the gate structure 300 includes the first metallic gate layer 320 and the one or more additional gate arrangements. In some embodiments, the first metallic gate layer 320 is built instead on one or more fin shaped channels or corners thereof.

The first metallic gate layer 320 comprises a plurality of metallic gate electrodes 325 along one or more channels 310. The gate structure 300 includes a plurality of gaps (not shown) between the metallic gate electrodes 325 of the first metallic gate layer 320.

The fabrication process comprises the following steps: (1) implementing two different gap widths, such that a first gap has a corresponding gap width X, and one or more remaining gaps have a corresponding gap width Y (i.e., forming at least one first trench having a first gap width X and forming at least one second trench having a second gap width Y), where the gap width Y is greater than the gap width X, (2) depositing at least one conformal dielectric layer 340 on the first metallic gate layer 320 (i.e., conformal dielectric deposition), such that the at least one conformal dielectric layer 340 completely fills the first gap having the corresponding gap width X (i.e., completely fills the at least one first trench) and partially fills each remaining gap having the corresponding gap width Y (i.e., partially fills the at least one second trench, such that a portion of the at least one second trench is unfilled), (3) depositing a conformal second metallic gate layer (not shown) on the at least one conformal dielectric layer 340 (i.e., conformal metallic gate layer deposition), such that the conformal second metallic gate layer fills any partially open space of each remaining gap having the corresponding gap width Y (i.e., fills up the unfilled portion of the at least one second trench), and (4) remove, via etching (e.g., blanket etch or CMP), one or more portions of the conformal second metallic gate layer (i.e., removing the one or more portions of the conformal second metallic gate layer to expose the at least one conformal dielectric layer 340), such that one or more additional portions 351 of the conformal second metallic gate layer remain ("remaining portions 351"). Blanket etch may be directional or isotropic, and does not use any mask. The one or more remaining portions 351 comprise self-aligned metallic gate electrodes 352. The fabrication process results in isolated self-aligned gates (i.e., the self-aligned metallic gate electrodes 352).

As shown in FIG. 3, the at least one conformal dielectric layer 340 fills up the first gap having the corresponding gap width X, and the one or more remaining portions 351 fill up the one or more remaining gaps having the corresponding gap width Y.

The fabrication process allows for integration of the self-aligned metallic gate electrodes 352 and one or more T-junction elements 301. Each T-junction element 301 is formed between/by more than two 1D arrays (e.g., more than two QD arrays) intersecting.

As shown in FIG. 3, the self-aligned gate structure 300 imposes/induces a 1D array of active/functional sites (e.g., qubits) in the linear channel sections (i.e., the one or more channels 310) and the one or more T-junction elements 301. As also shown in FIG. 3, a first gate layout of the first metallic gate layer 320 is in a first direction, and a second gate layout of the one or more remaining portions 351 of the conformal second metallic gate layer is in a second direction different from the first direction (i.e., the self-aligned gate structure 300 provides multi-directional connectivity). The fabrication process maintains high gate density using two metallic gate layers (i.e., the first metallic gate layer 320 and the one or more remaining portions 351) in two distinct directions.

In some embodiments, the gates could terminate on an edge or wide gate or other structure (i.e., the self-aligned gate structure 300 is terminated in a self-aligned manner).

FIG. 4 illustrates a top-down view of another example self-aligned gate structure 400 and cross-sectional views D-D and E-E of the gate structure, in accordance with some embodiments of the invention. In some embodiments, a fabrication process utilizes a gate structure 400 comprising a planar substrate 405 and a first metallic gate layer 420 built on the planar substrate 405. In some embodiments, there are one or more additional gate arrangements below the planar substrate 405, such that the gate structure 400 includes the first metallic gate layer 420 and the one or more additional gate arrangements. In some embodiments, the first metallic gate layer 420 is built instead on one or more fin shaped channels (e.g., two parallel running fins) or corners thereof (e.g., a single wide horizontal fin where active/functional sites (e.g., qubits) are formed at the corners of the fin).

The first metallic gate layer 420 comprises a plurality of metallic gate electrodes 425 along a pair of parallel channels 410. The gate structure 400 includes a plurality of gaps (not shown) between the metallic gate electrodes 425 of the first metallic gate layer 420.

The fabrication process comprises the following steps: (1) implementing two different gap widths, such that a pair of gaps has a corresponding gap width X, and one or more remaining gaps have a corresponding gap width Y (i.e., forming at least one first trench having a first gap width X and forming at least one second trench having a second gap width Y), where the gap width Y is greater than the gap width X, (2) depositing at least one conformal dielectric layer 440 on the first metallic gate layer 420 (i.e., conformal dielectric deposition), such that the at least one conformal dielectric layer 440 completely fills the pair of gaps having the corresponding gap width X (i.e., completely fills the at least one first trench) and partially fills each remaining gap having the corresponding gap width Y (i.e., partially fills the at least one second trench, such that a portion of the at least one second trench is unfilled), (3) depositing a conformal second metallic gate layer (not shown) on the at least one conformal dielectric layer 440 (i.e., conformal metallic gate layer deposition), such that the conformal second metallic gate layer fills any partially open space of each remaining gap having the corresponding gap width Y (i.e., fills up the unfilled portion of the at least one second trench), and (4) remove, via etching (e.g., blanket etch or CMP), one or more portions of the conformal second metallic gate layer (i.e., removing the one or more portions of the conformal second metallic gate layer to expose the at least one conformal dielectric layer 440), such that one or more additional portions 451 of the conformal second metallic gate layer remain ("remaining portions 451"). Blanket etch may be directional or isotropic, and does not use any mask. The one or more remaining portions 451 comprise self-aligned metallic gate electrodes 452. The fabrication process results in isolated self-aligned gates (i.e., the self-aligned metallic gate electrodes 452).

As shown in FIG. 4, the at least one conformal dielectric layer 440 fills the pair of gaps having the corresponding gap width X, and the one or more remaining portions 451 fill the one or more remaining gaps having the corresponding gap width Y.

As shown in FIG. 4, the fabrication process results in the self-aligned gate structure 400 comprising a grid of 1D arrays (e.g., grid of QD arrays) and the parallel channels 410. As also shown in FIG. 4 a first gate layout of the first metallic gate layer 420 is in a first direction, and a second gate layout of the one or more remaining portions 451 of the conformal second metallic gate layer is in a second direction different from the first direction (i.e., the self-aligned gate structure 400 provides multi-directional connectivity). The fabrication process maintains high gate density using two metallic gate layers (i.e., the first metallic gate layer 420 and the one or more remaining portions 451) in two distinct directions.

Figure 5:
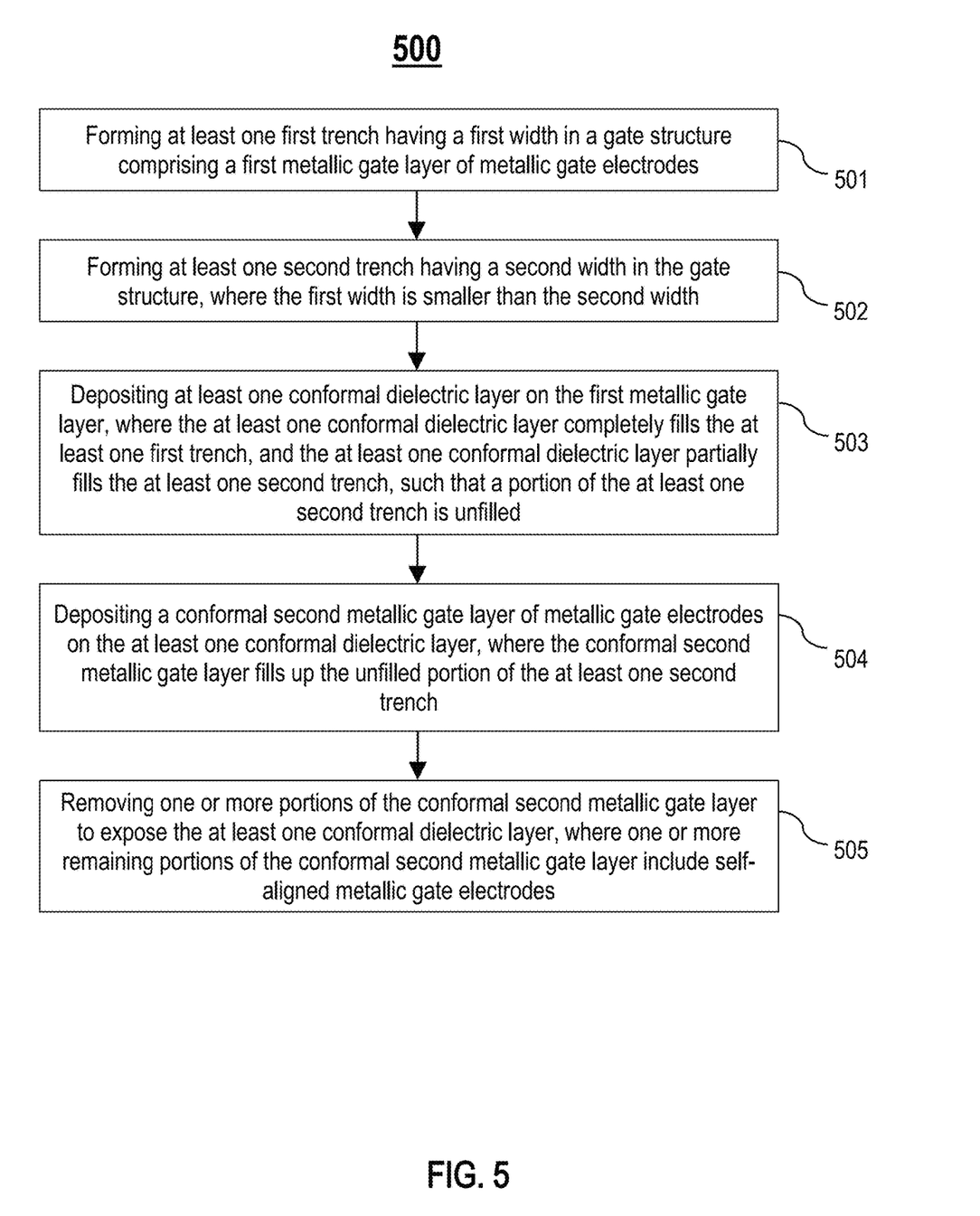
FIG. 5 is a flowchart for an example fabrication process for fabricating a self-aligned gate structure with multiple metallic gate electrodes, in accordance with some embodiments of the invention.

FIG. 5 is a flowchart for an example fabrication process 500 for fabricating a self-aligned gate structure with multiple metallic gate electrodes, in accordance with some embodiments of the invention. Process block 501 includes forming at least one first trench having a first width in a gate structure comprising a first metallic gate layer of metallic gate electrodes. Process block 502 includes forming at least one second trench having a second width in the gate structure, where the first width is smaller than the second width. Process block 503 includes depositing at least one conformal dielectric layer on the first metallic gate layer, where the at least one conformal dielectric layer completely fills the at least one first trench, and the at least one conformal dielectric layer partially fills the at least one second trench, such that a portion of the at least one second trench is unfilled. Process block 504 includes depositing a conformal second metallic gate layer of metallic gate electrodes on the at least one conformal dielectric layer, where the conformal second metallic gate layer fills up the unfilled portion of the at least one second trench. Process block 505 includes removing one or more portions of the conformal second metallic gate layer to expose the at least one conformal dielectric layer, where one or more remaining portions of the conformal second metallic gate layer include self-aligned metallic gate electrodes.

From the above description, it can be seen that embodiments of the invention provide a system, computer program product, and method for implementing the embodiments of the invention. Embodiments of the invention further provide a non-transitory computer-useable storage medium for implementing the embodiments of the invention. The non-transitory computer-useable storage medium has a computer-readable program, wherein the program upon being processed on a computer causes the computer to implement the steps of embodiments of the invention described herein. References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. § 112 (f), unless the element is expressly recited using the phrase "means for" or "step for."

The terminology used herein is for the purpose of describing particular embodiments of the invention only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a self-aligned gate structure with multiple metallic gate electrodes, comprising:
   forming at least one first trench having a first width in a gate structure comprising a first metallic gate layer of metallic gate electrodes;
   forming at least one second trench having a second width in the gate structure, wherein the first width is smaller than the second width;
   depositing at least one conformal dielectric layer on the first metallic gate layer, wherein the at least one conformal dielectric layer completely fills the at least one first trench, and the at least one conformal dielectric layer partially fills the at least one second trench, such that a portion of the at least one second trench is unfilled;
   depositing a conformal second metallic gate layer of metallic gate electrodes on the at least one conformal dielectric layer, wherein the conformal second metallic gate layer fills up the unfilled portion of the at least one second trench; and
   removing one or more portions of the conformal second metallic gate layer to expose the at least one conformal dielectric layer;
   wherein one or more remaining portions of the conformal second metallic gate layer include self-aligned metallic gate electrodes.

2. The method of claim 1, wherein a thickness of the at least one conformal dielectric layer is larger than a first value that is equal to half of the first width, and the thickness of the at least one conformal dielectric layer is smaller than a second value that is equal to half of the second width.

3. The method of claim 1, removing the one or more portions of the conformal second metallic gate layer comprises a blanket etch.

4. The method of claim 1, wherein removing the one or more portions of the conformal second metallic gate layer comprises chemical-mechanical polishing (CMP).

5. The method of claim 1, wherein the method isolates or terminates the self-aligned metallic gate electrodes.

6. The method of claim 1, wherein the self-aligned gate structure is one-dimensional (1D).

7. The method of claim 1, wherein the self-aligned gate structure is two-dimensional (2D).

8. The method of claim 1, wherein the self-aligned gate structure comprises at least one array of channels, fins, or functional sites that run in at least one linear section.

9. The method of claim 8, wherein the self-aligned gate structure further comprises at least one additional array of metallic gate electrodes that run in a different direction relative to the at least one array of channels, fins, or functional sites.

10. The method of claim 8, further comprising:
    fabricating one or more intersection elements, wherein each intersection element is between two or more channels, fins, or functional sites that run in different directions.

11. A structure comprising:
    a first metallic gate electrode located on at least one channel;
    a second metallic gate electrode separated from the first metallic gate electrode by a first width;
    a first dielectric layer located between the first metallic gate electrode and the second metallic gate electrode, wherein the first dielectric layer fills an area between the first metallic gate electrode and the second metallic gate electrode;
    a third metallic gate electrode separated from the second metallic gate electrode by a second width, wherein the second width is greater than the first width;

a second dielectric layer located between the second metallic gate electrode and third metallic gate electrode, wherein the second dielectric layer has a substantially uniform thickness along sidewalls of each metallic gate electrode and the at least one channel; and a self-aligned metallic gate electrode located between sidewalls of the second dielectric layer.

12. The structure of claim 11, wherein a thickness of the second dielectric layer is larger than half the first width.

13. The structure of claim 11, wherein the self-aligned metallic gate electrode is isolated or terminated.

14. The structure of claim 11, wherein the first metallic gate electrode, the second metallic gate electrode, and the third metallic gate electrode are substantially parallel.

15. The structure of claim 11, wherein the first metallic gate electrode and the second metallic gate electrode are not parallel.

16. The structure of claim 11, wherein the structure comprises at least one channel, fin, or functional site that runs in at least one linear section.

17. The structure of claim 16, wherein the structure further comprises at least one metallic gate electrode that runs in a different direction relative to the at least one channel, fin, or functional site.

18. The structure of claim 16, wherein the structure further comprises an intersection element.

* * * * *